US008283651B2

(12) United States Patent
Choi et al.

(10) Patent No.: US 8,283,651 B2
(45) Date of Patent: Oct. 9, 2012

(54) PHASE CHANGE MEMORY DEVICE HAVING AN IMPROVED WORD LINE RESISTANCE, AND METHODS OF MAKING SAME

(75) Inventors: Mi Ra Choi, Gyeonggi-do (KR); Jang Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 229 days.

(21) Appl. No.: 12/635,950

(22) Filed: Dec. 11, 2009

(65) Prior Publication Data

US 2010/0327249 A1  Dec. 30, 2010

(30) Foreign Application Priority Data

Jun. 30, 2009  (KR) .................. 10-2009-0058931

(51) Int. Cl.
*H01L 47/00* (2006.01)
*H01L 29/02* (2006.01)

(52) U.S. Cl. ............. 257/4; 257/2; 257/5; 438/102
(58) Field of Classification Search ........... 257/2, 42, 257/102
See application file for complete search history.

(56) References Cited

U.S. PATENT DOCUMENTS

| 2002/0060927 A1* | 5/2002 | Egawa et al. ............. 365/185.18 |
| 2004/0051094 A1* | 3/2004 | Ooishi .............................. 257/5 |
| 2006/0186483 A1* | 8/2006 | Cho et al. ...................... 257/390 |
| 2009/0050867 A1* | 2/2009 | Wells et al. ...................... 257/2 |

FOREIGN PATENT DOCUMENTS

| JP | 2-561380 A | 9/1996 |
| JP | 2001-093974 A | 4/2001 |
| KR | 1020090012580 A | 2/2009 |
| KR | 1020090117233 A | 11/2009 |

* cited by examiner

*Primary Examiner* — Kiesha Bryant
*Assistant Examiner* — Dmitriy Yemelyanov
(74) *Attorney, Agent, or Firm* — Ladas & Parry LLP

(57) ABSTRACT

A phase change memory device having an improved word line resistance and a fabrication method of making the same are presented. The phase change memory device includes a semiconductor substrate, a word line, an interlayer insulation film, a strapping line, a plurality of current paths, a switching element, and a phase change variable resistor. The word line is formed in a cell area of the semiconductor substrate. The interlayer insulation film formed on the word line. The strapping line is formed on the interlayer insulation film such that the strapping line overlaps on top of the word line. The current paths electrically connect together the word line with the strapping line. The switching element is electrically connected to the strapping line. The phase change variable resistor is electrically connected to the switching element.

11 Claims, 11 Drawing Sheets

PHASE CHANGE MEMORY DEVICE HAVING AN IMPROVED WORD LINE RESISTANCE, AND METHODS OF MAKING SAME

CROSS-REFERENCE TO RELATED APPLICATIONS

The present application claims priority under 35 U.S.C 119(a) to Korean Application No. 10-2009-0058931, filed on Jun. 30, 2009, in the Korean Intellectual Property Office, which is incorporated herein by reference in its entirety as set forth in full.

BACKGROUND

1. Technical Field

Exemplary embodiments relate to nonvolatile memory devices. In particular, exemplary embodiments are concerned with phase change memory devices, layout structures thereof, and fabrication methods thereof.

2. Related Art

One type of phase change random access memory (hereinafter, referred to as "PRAM") is a nonvolatile memory device that exhibits different resistivities for different corresponding solid state phases in which the solid state phases can be interchanged by carefully controlling the amount and/or flux of heat, usually Joule heat, imposed on these materials. A typical phase changeable material often comprises a chalcogenide compound consisting of germanium (Ge), antimony (Sb) and tellurium (Te). Typical phase changeable materials transitionally interchange between into a disordered amorphous to an ordered crystalline solid state driven by imposing Joule heat conditions. The disordered amorphous state usually is arbitrarily assigned to logical data "1" and the ordered crystalline state is assigned to logical data "0". Alternately the disordered amorphous state can be arbitrarily assigned to logical data "0" and the ordered crystalline state can be assigned to logical data "1".

A memory cell of a PRAM is typically composed of a variable resistor and a switching element. The variable resistor is made of a phase changeable material coupled between a word line and a bit line. The switching element is used to selectively drive the variable resistor.

Usually in PRAM devices, word lines are provided in a form of junction regions in a semiconductor substrate and bit lines are provided in a form of wiring. The switching elements are often times diodes or metal-oxide-semiconductor (MOS) transistors.

It is well known that a word line of a junction region usually exhibits a very large resistance relative to another line pattern having the same length. Further, as the number of memory cells coupled to the word line of junction region increase, so does the rate of word line delay increases. This problem is especially aggravated with an increase of integration density of the PRAM, and as a result the word line delay of PRAMs is prone to becoming excessively large.

Referring to FIG. 1, in order to lessen a voltage delay brought about by an increase of resistance on a word line WL of junction region, a strapping line ST_WL for applying a uniform voltage to memory cells coupled to the word line WL is formed over bit lines BL.

This strapping line ST_WL is usually made of a relatively high conductivity metal and is electrically connected to the word line WL of junction region through a contact CT such as contact plug or stud. In FIG. 1, PA denotes a peripheral area and CA denotes a cell area.

However, since the strapping line ST_WL is disposed over the bit lines BL, the height of the contact CT increases by a distance between the word line WL of junction region and the strapping line ST_WL. Such an increase of the contact height causes a signal path to exhibit an undesirable delay and makes the word line resistance increase.

Furthermore, as aforementioned, the contact CT must be provided for electrically connect (i.e., Ohmic contact) the strapping line ST_WL with the word line WL of junction region. In this structural configuration, since the contact CT has to occupy a space in a cell area CA and since an interval is required between the contact CT and a bit line contact 30 that electrically connects the bit line BL with a phase changeable material 20, then this structural configuration consequently results in enlarging a cell size of the PRAM.

SUMMARY

In an embodiment, a phase change memory device includes: a semiconductor substrate having cell and peripheral areas; a word line formed in the semiconductor substrate of the cell area; a strapping line formed to overlap with the word line; a plurality of current paths electrically connecting the word line with the strapping line; and a switching element formed on the strapping line.

In another embodiment, a phase change memory device includes: a semiconductor substrate in which cell and peripheral areas are defined; a strapping line formed on the semiconductor substrate of the cell area; a diode formed on the strapping line; a variable resistor formed on the diode and electrically connected to the diode; a bit line formed on the variable resistor and electrically connected to the variable resistor; a word line pattern formed under the strapping line; and a current path configured to electrically connect the bottom of the strapping line with the word line pattern.

Exemplary embodiments also provide a layout structure of a phase change memory device, which may include a plurality of cell array areas in which pluralities of word and bit lines are arranged. The cell array area may include: a strapping line overlapping with the word lines; and a plurality of current paths electrically connecting the word line to the strapping line. The cell array areas may be continuously stacked without an interval. The strapping line may extend without disconnection on the stacked cell array areas.

According to exemplary embodiments, a method of fabricating a phase change memory device is comprised of: preparing a semiconductor substrate including cell and peripheral areas; forming a word-line driving transistor in the peripheral area of the semiconductor substrate; forming a word line in the cell area; forming a first interlayer insulation film on the semiconductor substrate including the word line and the word-line driving transistor; forming a strapping line to be electrically connected with the word line, on the first interlayer insulation film, and a first line to be electrically connected with the word-line driving transistor; and forming a switching element on the strapping line.

A further understanding of the nature and advantages of the present invention herein may be realized by reference to the remaining portions of the specification and the attached drawings.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. It is also understood herein that the drawings are not necessarily to scale and in some instances proportions may have been exaggerated in order to more clearly depict certain features of the invention. In the figures.

DESCRIPTION OF EMBODIMENTS

Various exemplary embodiments will now be described in more detail with reference to the accompanying drawings in which some exemplary embodiments are shown. However, specific structural and functional details disclosed herein are merely representative for purposes of describing exemplary embodiments. This invention, however, may be embodied in many alternate forms and should not be construed as limited to only exemplary embodiments set forth herein. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be hereinafter described in detail with reference to the attached drawings.

An embodiment of the present invention provides a PRAM device including a strapping line ST_WL under a switching element D.

Figure 2:
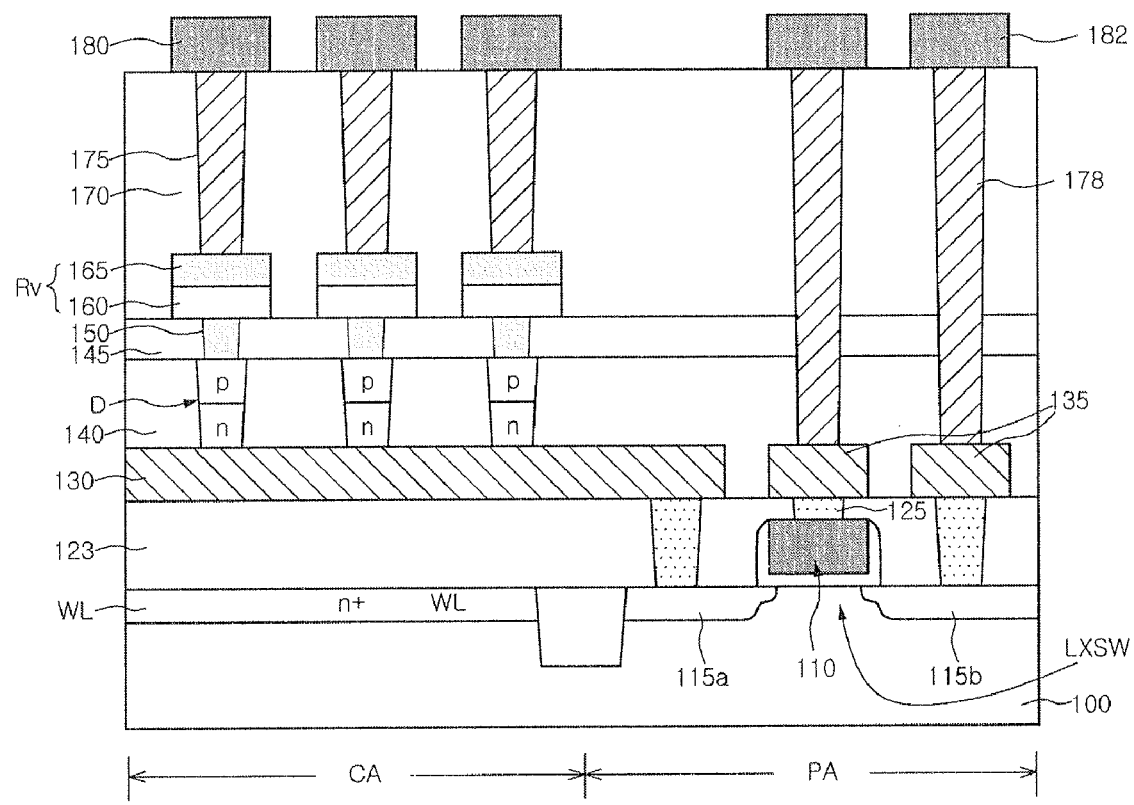
FIG. 2 is a section of a PRAM device according to an embodiment of the present invention.

Referring to FIG. 2, the PRAM device includes a semiconductor substrate 100 in which a cell area CA and a peripheral area PA are divided by an isolation film 105. The cell area CA is prepared to accommodate memory cells (i.e., PRAM cells). The peripheral area PA is disposed outside of the cell area CA and prepared to accommodate driving or control elements for reading/writing data from/into the memory cells.

On the semiconductor substrate 100 in the peripheral area PA is formed a word-line driving transistor LXSW. The word-line driving transistor LXTW may be composed of a gate 110, and a source 115a and a drain 115b which are placed adjacent to both sides of the gate 110. The gate 110 of the word-line driving transistor LXTW may be made of polycrystalline silicon. Between the gate 110 and the semiconductor substrate 100 is interposed a gate insulation film. On both sides of the gate 110 are formed spacers.

Over the semiconductor substrate 100 in the cell area CA, a strapping line 130 is disposed on a first interlayer insulation film 123 in which first interlayer insulation film 123 is between the strapping line 130 and the semiconductor substrate 100. The strapping line 130 may be made of a high heat-resistive metal, e.g., tungsten (W). The strapping line 130 is electrically connected to the source 115a (or drain 115b) of the word-line driving transistor LXSW by way of one of first plugs 125 that penetrates through the first interlayer insulation film 123. In this embodiment, the strapping line 130 acts as a word line WL of the PRAM device.

Meanwhile, in the peripheral area PA, the gate 110 and the drain 115b respectively contact with the first lines 135 through the first plugs 125.

On the strapping line 130, a plurality of diodes D, that act as switching elements, is arranged in a substantially uniform interval. The diodes D are electrically isolated away from each other through a second interlayer insulation film 140. Here, if the strapping line 130 is made of polycrystalline silicon, the diode D becomes a silicon Schottky diode. If the strapping line 130 is made of a metal, the diode D becomes a metallic Schottky diode.

Heat electrodes 150 are laid respectively on the diodes D. The heat electrode 150 may have a diameter smaller than the diode D and may be formed of a relatively high resistivity conductor. While this embodiment adopts the heat electrode 150 in a cylindrical shape, it is understood herein that this configuration is not restrictive hereto and other geometric configuration patterns are envisioned and thus available for the heat electrode 150.

Further, although not shown in the drawing, an ohmic contact layer may be formed on the diode D when the heat electrode 150 is made of a metallic material.

Variable resistors Rv are placed respectively on a third interlayer insulation film 145 that includes the heat electrodes 150. The variable resistors Rv may be formed of a stacked film composed of a phase changeable film 160 and a top electrode 165. The phase changeable film 160 is where a solid phase change can be reversibly transitioned into a set or reset state in response to a current supplied between the heat electrode 150 and the top electrode 165. The heat electrode 150 and the top electrode 165 may be made of the same or different type of conductive material from each other.

A fourth interlayer insulation film 170 is formed by covering the structure that includes the variable resistors Rv. Bit lines 180 are arranged on the fourth interlayer insulation film 170 to overlap the corresponding variable resistors Rv. The variable resistors Rv and the bit lines 180 are electrically connected to each other by way of second plugs 175.

In the peripheral area PA, second lines 182 are arranged on the third interlayer insulation film 170 and the second lines 182 are electrically connected to the first lines 135 by way of the third plugs 178.

According to this embodiment, the word line is formed in a conductive pattern, which has lower resistance than in the junction region, under the switching element. Thus, there is no need of preparing an additional region for word line contact in the presently embodied PRAM device.

In the structure shown in FIG. 2, as the first interlayer insulation film 123 is only provided under the strapping line 130, the lower structure would be unstable and prone to causing a dishing effect brought about by a chemical-mechanical polishing (CMP) process.

Figure 3:
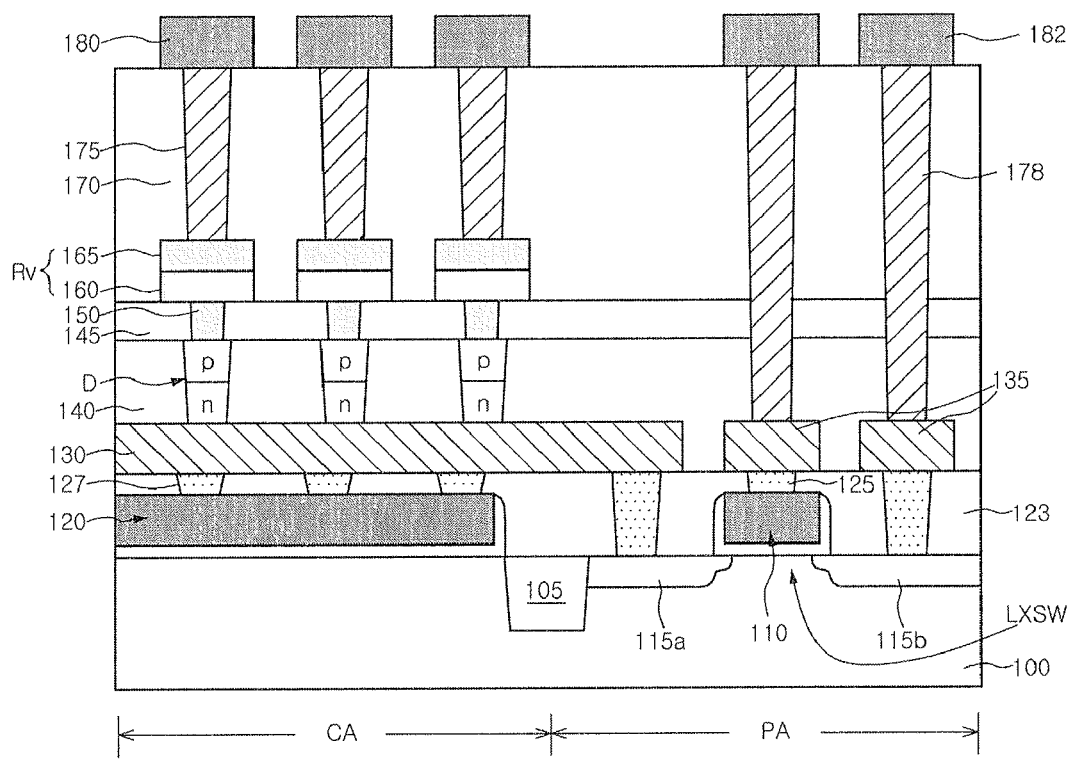
FIG. 3 is a section of a PRAM device according to another embodiment of the present invention.

For this reason, referring to FIG. 3, a PRAM device may be embodied further including a word line pattern 120 supporting the strapping line 130, and a plurality of current paths 127.

In detail, the word line pattern 120 is formed in the semiconductor substrate 100 under the strapping line 130. The word line pattern 120 may be configured in the substantially the same structure with the gate 110 of the word-line driving transistor LXSW, which can be used to substantially act as a word line in this embodiment. The strapping line 130 is formed to overlap the word line pattern 120.

The current paths 127 function as electrically connections between the strapping line 130 and that of the word line pattern 120. The current paths 127 may be formed of the same material as with the first plugs 125. Accordingly, the word line pattern 120 is electrically connected to the strapping line 130 by way of the current paths 127.

Figure 4:
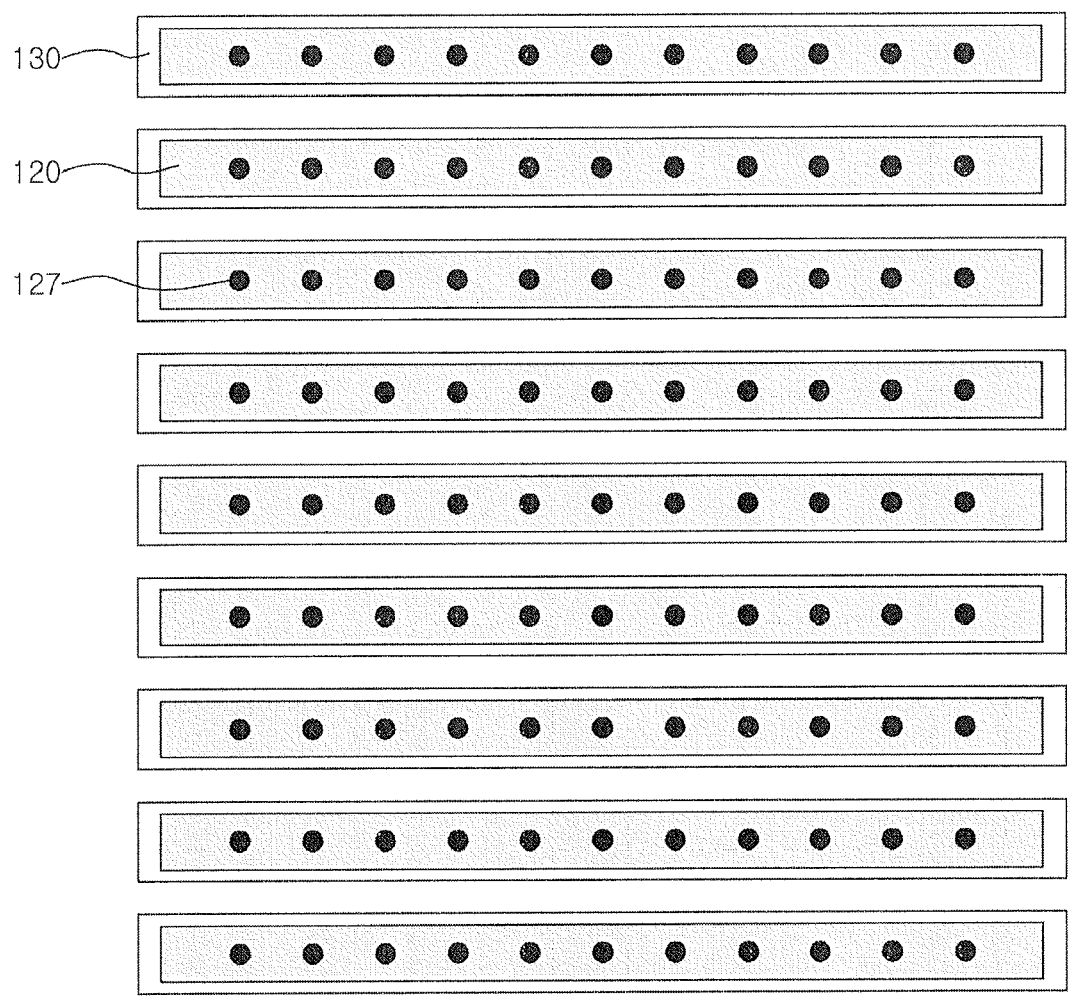
FIGS. 4 through 8 are plans of the PRAM devices according to the embodiments.

One variation of the word line pattern 120, as illustrated in FIG. 4, is that it can be configured in a linear shape and may be disposed in a parallel pattern and may be aligned to overlap the strapping line 130.

Figure 5:
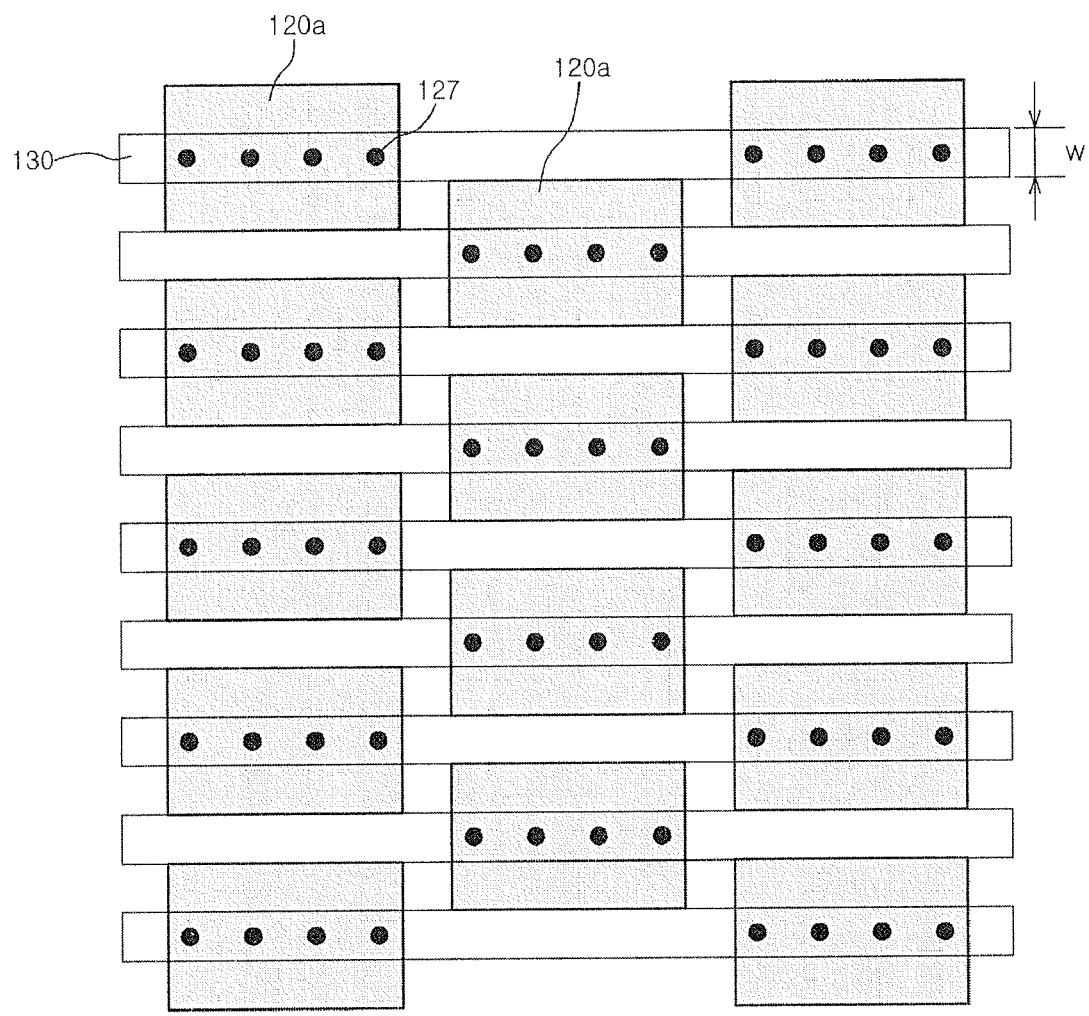
Figure 6:
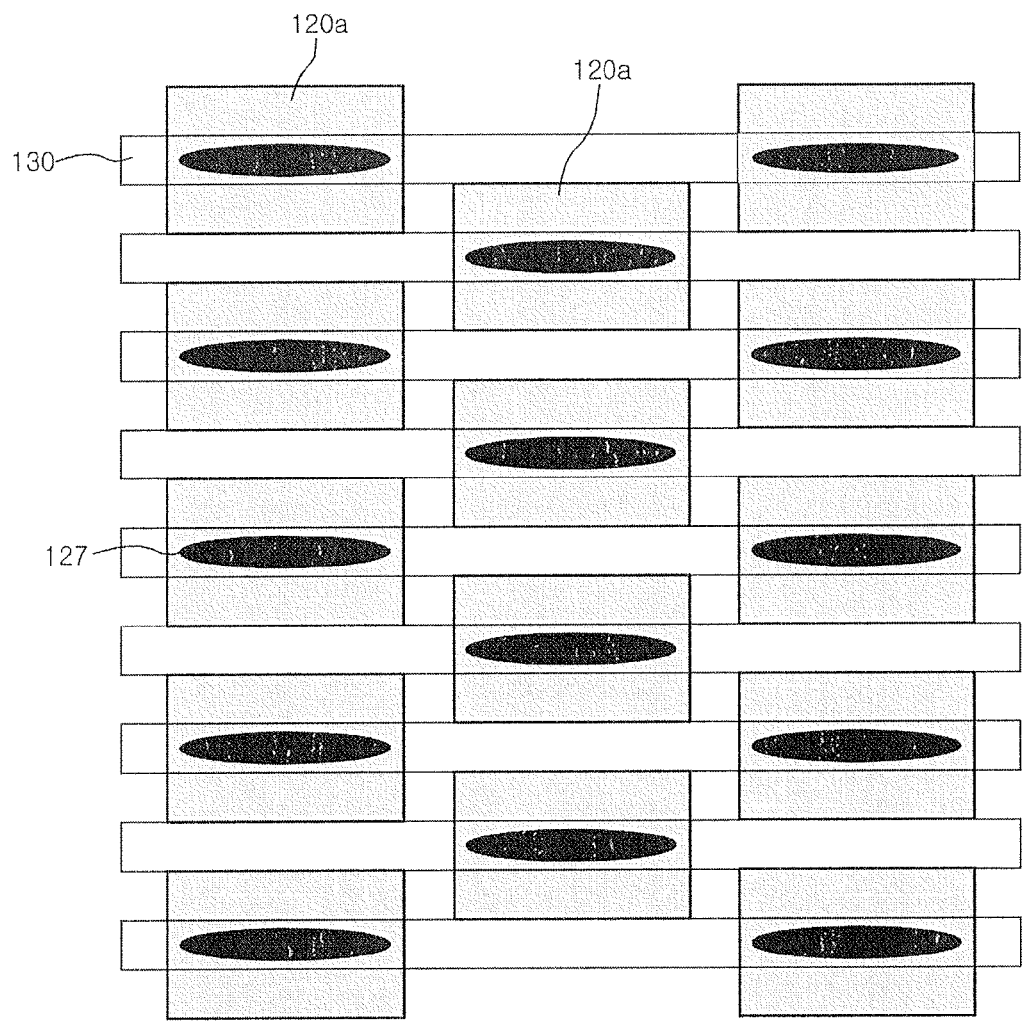
Figure 7:
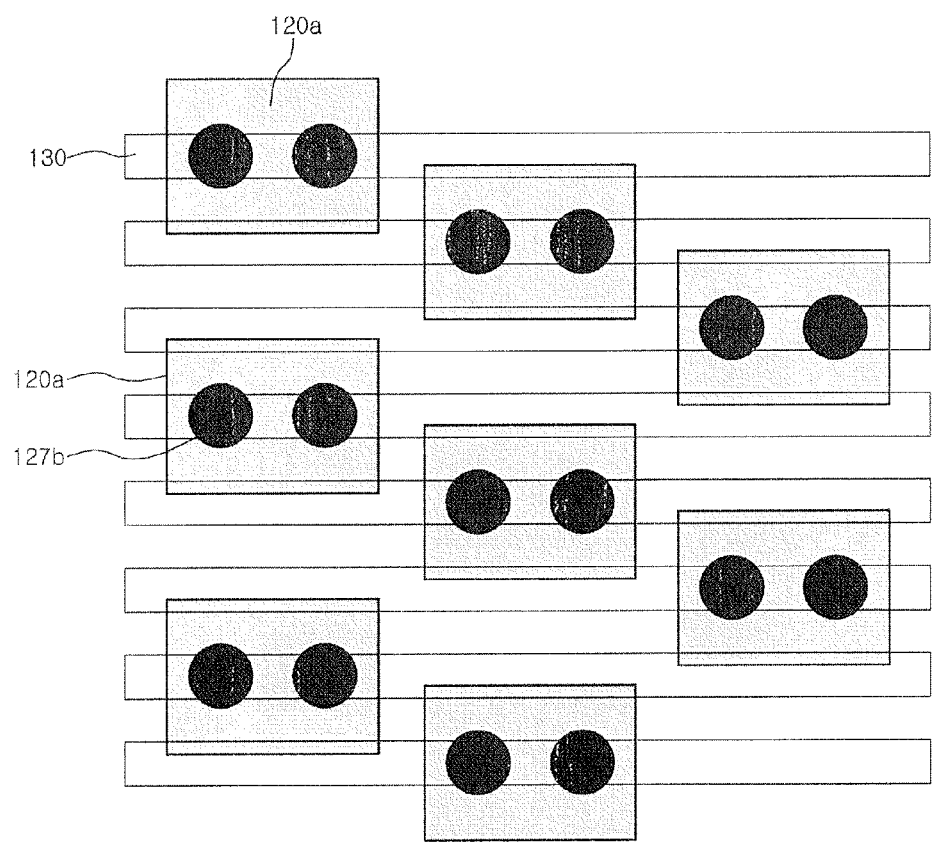

On the other hand, referring to FIG. 5 through 7, word line patterns 120a may be aligned in an island type arrangement pattern. The word line pattern 120a of the island type arrangement pattern may be formed in plurality to a single one of the strapping line 130 with a uniform interval.

For example, as shown in FIGS. 5 and 6, one of the word line pattern 120a can be aligned to only overlap with an even member of the strapping lines 130 by being placed between others word line patterns 120a that are aligned to only overlap with an odd member of the strapping lines 130.

Further, as shown in FIG. 7, the word line patterns 120a of islands may be shiftingly disposed in a predetermined interval along the order of the strapping lines 130. Thus, the word line patterns 120a are seen as arranged in a step on plane.

Figure 8:
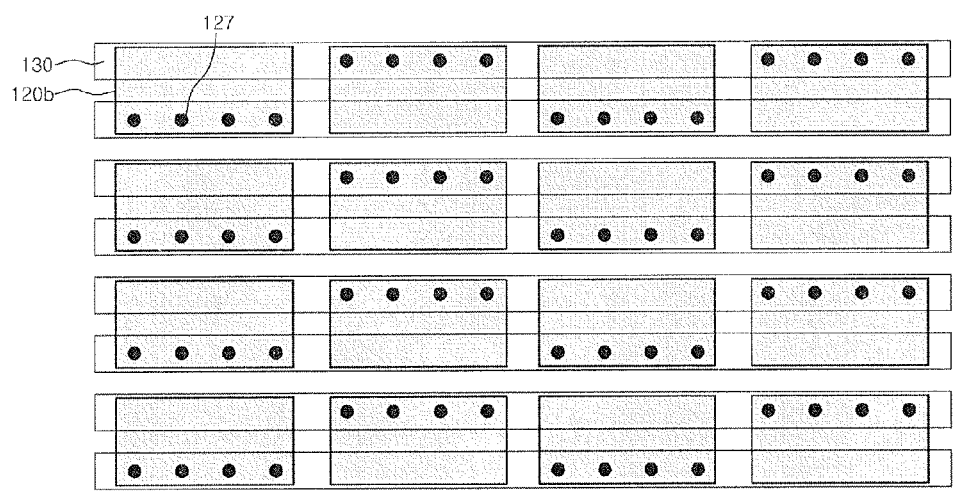

Otherwise, referring to FIG. 8, there may be provided word line patterns 120b that are arranged in a symmetrical matrix pattern of islands, each word line pattern 120b overlapping two adjacent members of the strapping lines 130. And, the current path 127 contacts with only one of the strapping lines 130 that are overlapped thereon. In this embodiment one grouping of word line patterns 120b is arranged along the strapping line 127 so that this grouping is electrically connected to the upper overlapped strapping lines 130 by way of the current path 127, while another grouping of the word line patterns 120b is electrically connected to the lower overlapped strapping lines 130 by way of the current path 127.

The current path 127, as shown in FIGS. 4, 5 and 8, may be formed in a diameter (line width) smaller than a width (w) of the strapping line 130. Further, as illustrated in FIG. 6, the current path 127 may be configured to have its upper side shaped in a slit pattern. Otherwise, the current path 127, as shown in FIG. 7, may be formed in a diameter larger than the width of the strapping line 130.

Accordingly, the combination of the current paths 127 and the word line pattern 120 acts as a shunting layer that more uniformly branches out a current flow which reduces equivalent resistance differences between the word line (the structure including the word line pattern, the current path and the strapping line).

Figure 1:
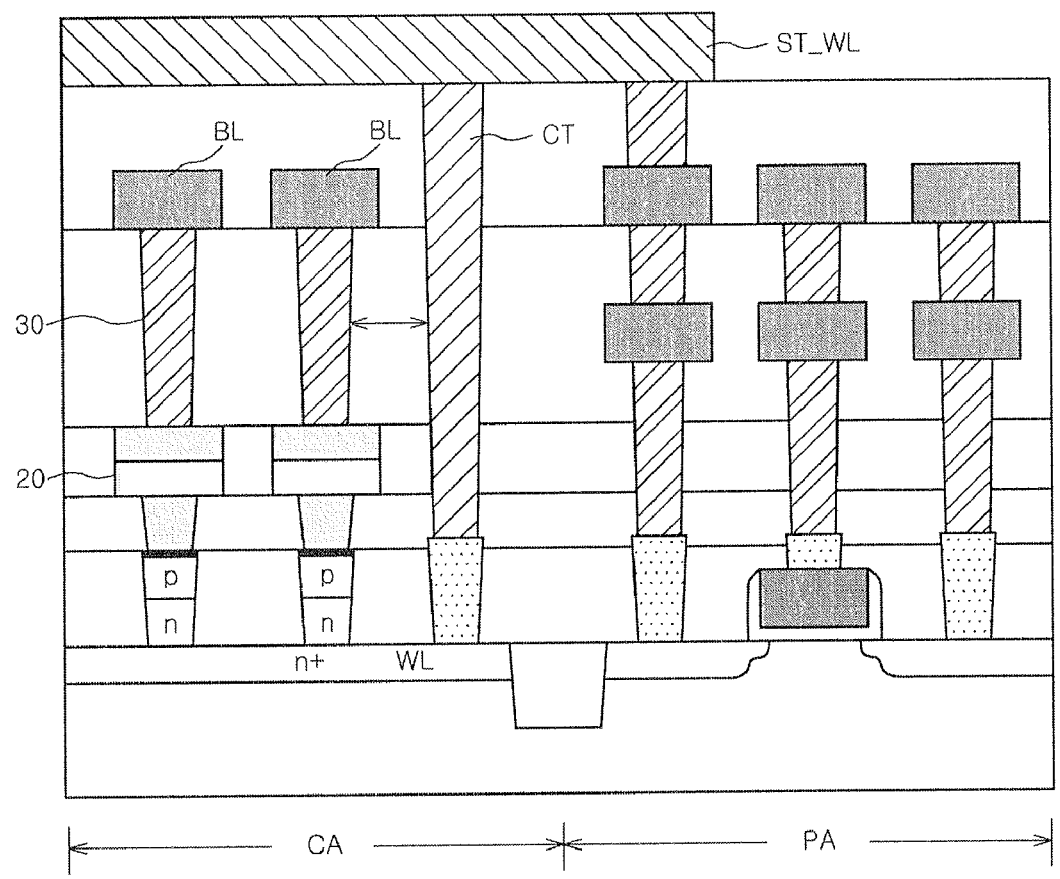
FIG. 1 is a section of a general PRAM device.

In addition, as can be seen from FIG. 3, since the word line pattern 120 is leveled at a predetermined height, the distance between the word line pattern 120 and the strapping line 130, i.e., a height (or thickness) of the current path 127 becomes substantially smaller with regards to that of the height of the contact CT as depicted in FIG. 1. Thus with this structure of the present PRAM device a reduction in the word line resistance can be realized.

Furthermore, since the current paths 127 electrically connecting the strapping line 130 and the word line pattern 120 are all placed under the strapping line 130, then there is no need for an additional contact region and for a spatial margin thereof for linking the strapping line 130 with a dummy gate 120.

With this structure of the PRAM device according to these exemplary embodiments of the present invention, the word line pattern 120 and the plural current paths 127 contribute to realizing a longer word line exhibiting a given specification of resistance.

Figure 9:
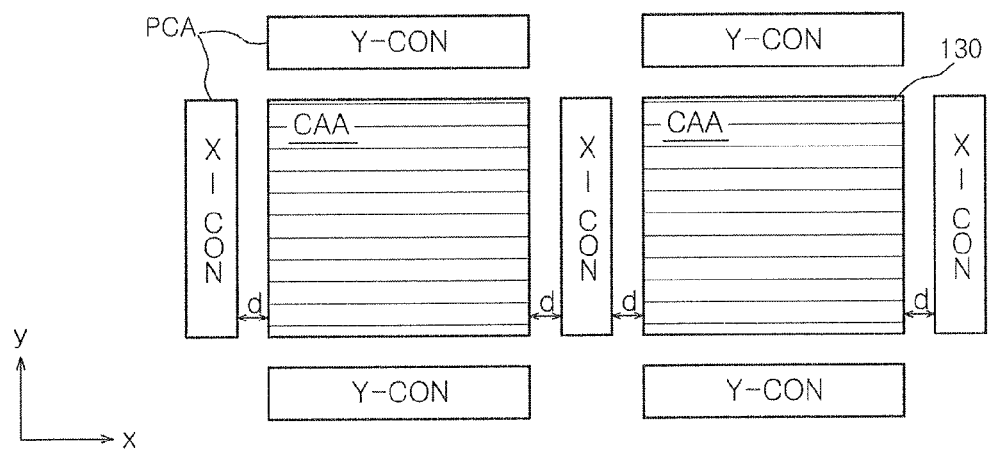
FIG. 9 is a plan of a general PRAM chip.

In further detail, as shown in FIG. 9, a general PRAM chip 200 is can be configured in a cell array area CAA and in a peripheral circuit field PCA. The cell array area CAA may include the cell area CA and the peripheral circuit field PCA may include the peripheral area PA.

A row control block X-CON may be disposed in the peripheral circuit field PCA and be coupled to word lines that extend along an X-direction in the cell array area CAA. A column control block Y-CON may be disposed in the peripheral circuit field PCA and be coupled to bit lines that extend along a Y-direction in the cell array area CAA. The row control block X-CON may include word-line driving transistors LXSW and the column control block Y-CON may include bit-line driving transistors LYSW. The row and column control blocks, X-CON and Y-CON, are required to be apart from the cell array area CAA in a predetermined interval d.

Different from the disposition shown in FIG. 9, in this embodiment, since the word line pattern 130 and the current paths 127 are formed under the strapping line 130 of the cell array area CAA, then the resistive characteristic of the word line can be highly improved to permit a length of the word line to be longer. Thereby, it is possible to increase the number of memory cells (i.e., the number of diodes and variable resistors) per word line. In exemplary embodiments of the present invention, a length of word line may mean a length of the strapping line 130.

Figure 10:
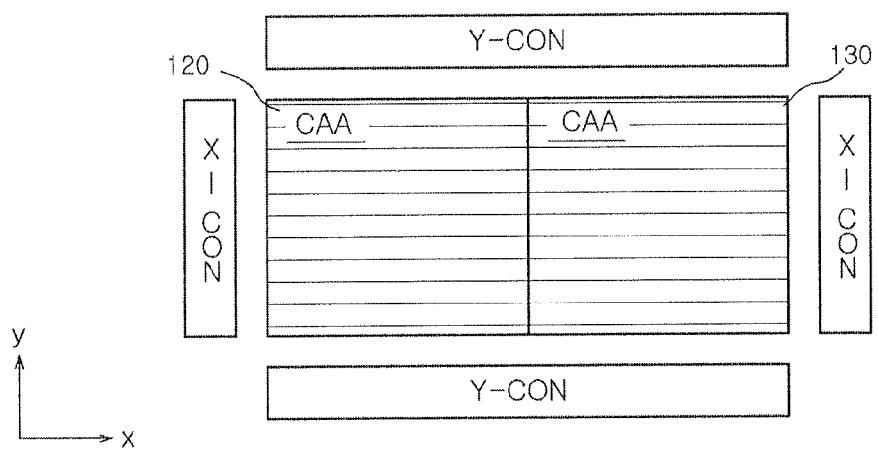
FIG. 10 is a plan of a PRAM chip according to an embodiment of the present invention.

Regarding such a condition, referring to FIG. 10, a plurality of cell array areas CAA is continuously arranged and the word lines, i.e., the strapping lines 130, are disposed to intersect the cell array areas CAA without any division. This structure that the strapping lines 130 are disposed to intersect a series of the memory array areas without disconnection will be referred to as "stacked cell array".

The row control blocks X-CON and the column control blocks Y-CON, respective to the plural cell array areas CAA, are each consolidated and disposed at the periphery of the stacked cell array area. The unified row and column control blocks disposed at the periphery of the stacked cell array area may have an area corresponding to summing the divided row and column control blocks X-CON and Y-CON.

By stacking the plural cell array area CAA and consolidating the row and column control blocks at the fringes of the stacked cell array area, it is able to shorten the distances d between the cell array areas CAA and the row control blocks X-CON, reducing an area of the PRAM chip.

Figure 11:
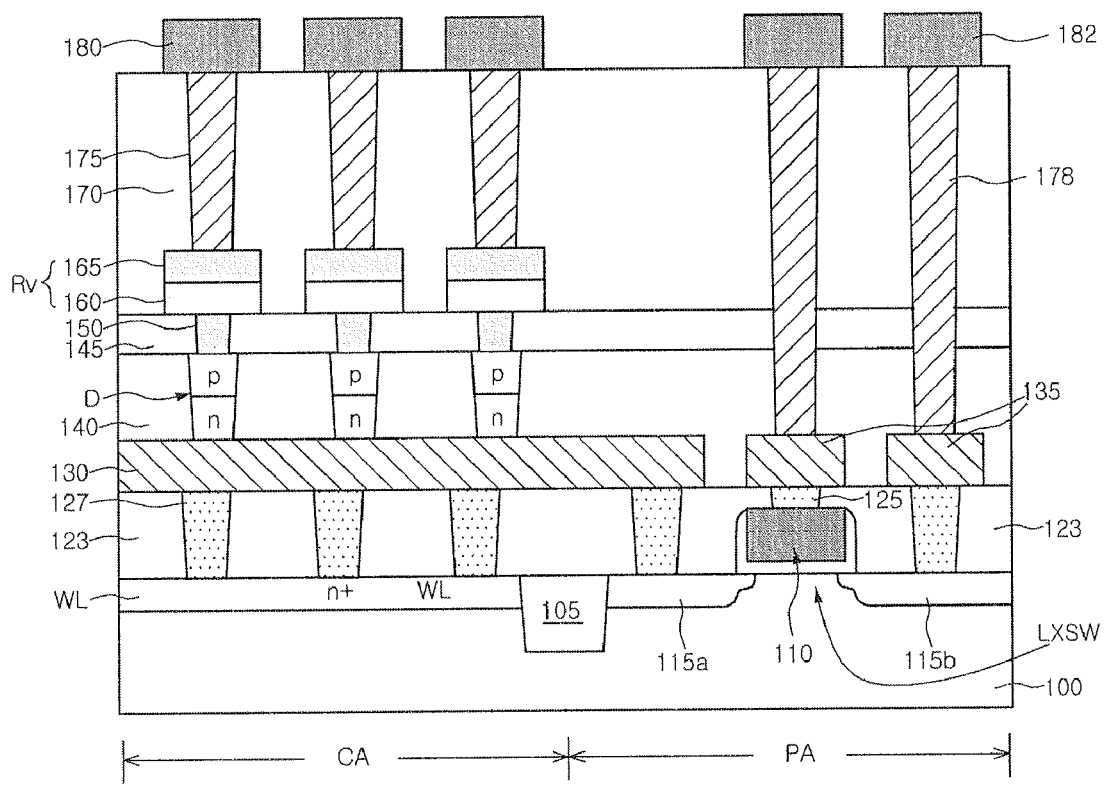
FIG. 11 is a section of a PRAM device according to still another embodiment of the present invention.

Further, referring to FIG. 11, it is possible to accomplish a shunting effect by forming the word line WL in a form of junction region (i.e., a junction word line), without the word line pattern 120, and simply forming the plural current paths 127 between the strapping line 130 and the junction word line.

Now hereinafter will be described a fabrication method of the PRAM device by the exemplary embodiments in conjunction with FIGS. 12 through 14.

Figure 12:
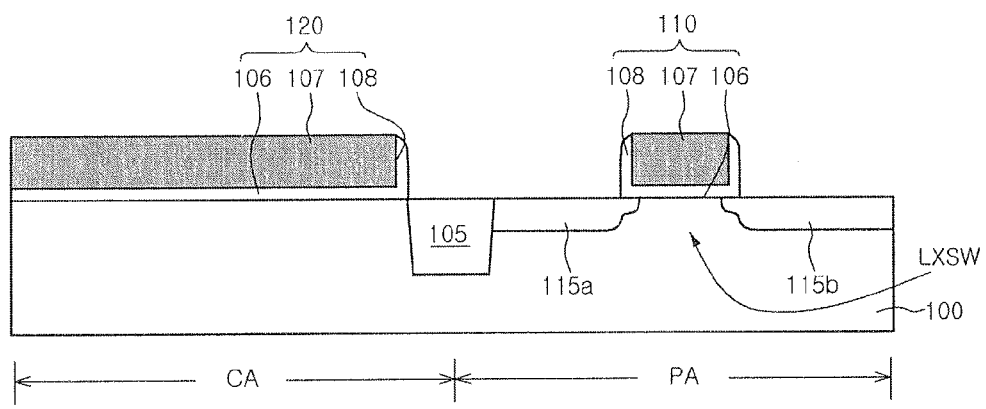
FIGS. 12 through 14 are sections illustrating a fabrication method of the PRAM device by an embodiment of the present invention.

First, referring to FIG. 12, the field isolation film 105 is selectively formed in the semiconductor substrate 100 by means of any number of well known processes such as field oxidation. Thereby, the cell area CA and the peripheral area PA are confined and defined in the semiconductor substrate 100.

Next, after sequentially stacking a gate insulation film 106 and a conductive gate layer 107 on the semiconductor substrate 100, the conductive gate layer 107 and the gate insulation film 106 are selectively patterned and partly removed in the cell and peripheral areas CA and PA. Then, an insulation film is uniformly depositing on the resultant structure of the semiconductor substrate 100 and anisotropically etched so that both sides of the patterned conductive gate layer 107 and gate insulation film 106 are covered to form the spacer insulation films 108. Thereby, the gate 110 of the word-line driving transistor LXSW is structured in the peripheral area PA, while the word line pattern 120 is formed in the cell area CA. Impurities are implanted into the semiconductor substrate 100, at both sides of the gate 110, to form the source 115a and the source 115b. Thereby, the word-line driving transistor LXSW is completed in the peripheral area PA. Forming the source 115a and the drain 115b may be carried out under the condition of exclusively opening the peripheral area PA.

During this, as illustrated in FIG. 11, in the structure without the word line pattern 120, the junction word line WL is formed by patterning the gate insulation film 106 and patterning the conductive gate layer 107 so as to partly leave them only in the peripheral area PA. The step of forming the source 115a and the drain 115b can be performed at the same time by selectively implanting impurities into the cell area CA.

Figure 13:
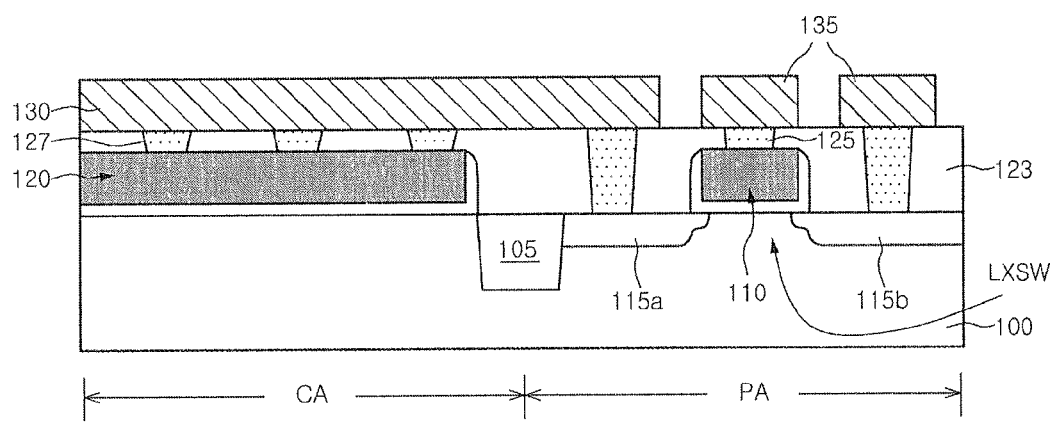

Continuously, referring to FIG. 13, the first interlayer insulation film 123 is deposited on the resultant structure of the semiconductor substrate 100 which already includes the word-line driving transistor LXSW. The first interlayer insulation film 123 may be made of silicon oxide. Then, the first interlayer insulation film 123 is selectively etched away to form (not shown) contact holes which partly expose the upper side of the word line pattern 120, the gate 110, the source 115a and the drain 115b of the word-line driving transistor LXSW. The contact holes are subsequently filled in with a conductive layer to form the first plugs 125 and to form the current paths 127. A conductive layer forming the first plugs 125 and the current paths 127 may be made of doped polycrystalline silicon or metal such as tungsten (W).

Next, after depositing a first conductive layer on the first interlayer insulation film 123 including the first plugs 125 and the current paths 127, the first conductive layer is patterned to form the strapping line 130 and the first lines 135. The strapping line 130 is electrically connected to the first plugs 125 that are electrically connected to the current paths 127 and the source 115a of the word-line driving transistor LXSW. The first lines 135 are electrically connected to the gate 110 and to the drain 115b, respectively, of the word-line driving transistor LXSW. The first conductive layer forming the strapping line 130 and the first lines 135 may be made of a high heat-resistive and high-conductive metal, e.g., tungsten (W).

Figure 14:
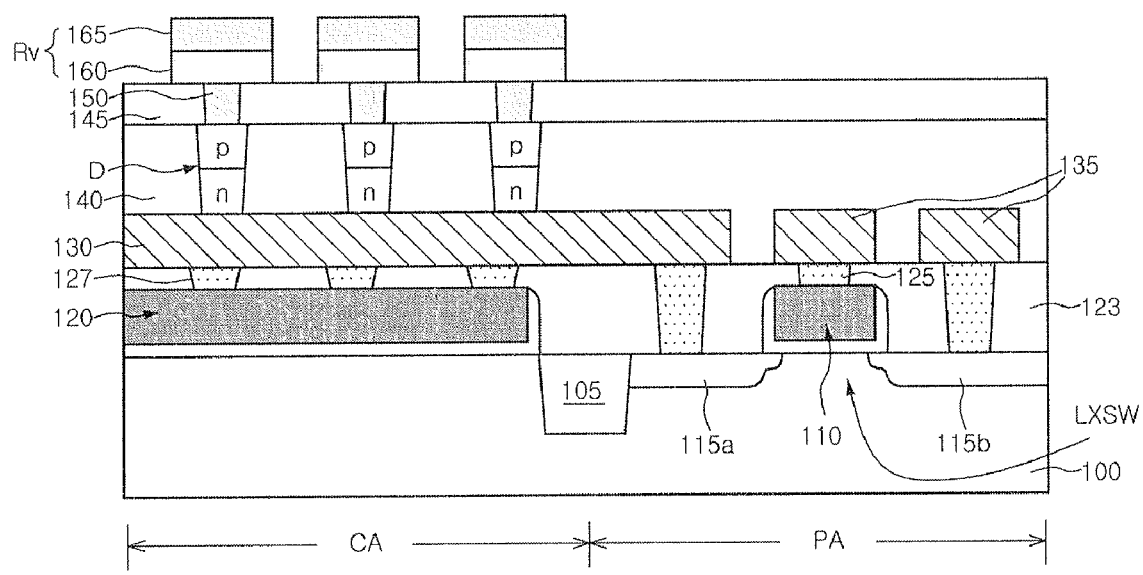

Then, referring to FIG. 14, after depositing the second interlayer insulation film 140 on the resultant structure of the semiconductor substrate 100 that includes the strapping lines 130 and the first lines 135, the second interlayer insulation film 140 is selectively etched away to partly expose the strapping line 130 and to form a plurality of diode contact holes (not shown). The diode contact holes are subsequently filled in with a polycrystalline silicon film doped with N-type impurities. The diodes D are formed by implanting P-type impurities into the doped polycrystalline silicon film of the diode contact holes. The diode D are laid on the strapping line 130 and made of a polycrystalline material formed by deposition, and subsequently become Schottky diodes. While this embodiment is described as forming the diodes D with a polycrystalline silicon film from the diode contact holes, it is also permissible to, after completing the diodes D by patterning the polycrystalline film, deposit the second interlayer insulation film 140 over the structure of the diodes D.

Next, the third interlayer insulation film 145 is formed on the second interlayer insulation film 140 including the diodes D. The third interlayer insulation film 145 may be made of high heat-resistive silicon nitride. Then, the third interlayer insulation film 145 is selectively etched away to expose the tops of the diodes D to form heat-electrode contact holes (not shown). These heat-electrode contact holes are subsequently filled in with a conductive film to form the heat electrodes 150. The heat electrode 150 may be made of any number of various kinds of high heat-generative conductors such as doped polycrystalline silicon, silicon germanium (SiGe), titanium nitride, etc., e.g., a high resistivity conductor. If the heat electrode 150 is made up of a metal film, it is herein envisioned to further form ohmic contact layers (not shown) on the tops of the diodes D before depositing the third interlayer insulation film 145.

Afterward, the phase changeable film 160 and the top electrode layer 165 are sequentially stacked on the third interlayer insulation film 145. The phase changeable film 160 may be made of a chalcogenide containing compound. The top electrode layer 165 and the phase changeable film 160 are then subsequently patterned to contact with the heat electrodes 150 and to form the variable resistors Rv.

In subsequent processing steps, referring to FIGS. 2 and 3, the fourth interlayer insulation film 170 is deposited on the structure of the semiconductor substrate 100 that have the variable resistors Rv. After forming via holes (not shown) to expose the variable resistors Rv of the cell area CA and the first lines 135 of the peripheral area PA, the via holes are then filled in with a conductive layer to form the second plugs 175 act as bit line contacts and as the third plugs 178. Next, by using any number of well known processing techniques, the bit lines 180 are formed to contact with the second plugs 175 and the second lines 182 are formed to contact with the third plugs 178.

As described above in detail, for the purpose of reducing the resistance of the word line, the strapping line composed of relatively highly conductive material is formed under the switching element, i.e., the diode, and the current paths are provided between the word line and the strapping line. Therefore, a reduction in the resistance of the word line can be realized by way of the highly conductive strapping line and the resistance can be further reduced by way of the plural current paths that contribute to helping signal transmission through the word line.

In addition, according to the exemplary embodiments stated above, since the word line is configured in a form of wiring by the same manner with the gate of the word-line driving transistor, it is also effective in improving the resistance characteristics of the word line, as well as shortening a distance to the strapping line and reducing the resistance of the word line in itself.

Such improvement to the present PRAM resistance characteristics may permit the corresponding word line to be extended because it exhibits a lower resistance and as a result enables more cell array areas to be stacked along the word line. Thus, it is possible to realize a better area margin for chip size in the extension of the word line.

Further, since the current paths and the word line of wiring type can be formed at the same time with the gate of the word-line driving transistor and the plugs and the strapping line can be formed at the same time with the first line, then there is no need to carryout out an additional processing step for them.

Moreover, since the strapping line formed in the cell area of the PRAM device is sustained by the current paths, i.e., a plurality of plugs, a dishing effect is less likely to occurs subsequent to a CMP process.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A phase change memory device, comprising:
   a semiconductor substrate including cell and peripheral areas separated by an isolation film;
   a word line formed in the cell area of the semiconductor substrate; an interlayer insulation film formed on the word line;
   a strapping line formed on the interlayer insulation film such that the strapping line overlaps on top of the word line;
   a plurality of current paths electrically connecting the word line with the strapping line;
   a switching element formed on top of the strapping line; and
   a phase change variable resistor formed over the switching element, wherein the phase change variable resistor is electrically connected to the switching element, wherein the word line is configured in an island type arrangement pattern that is partly overlapped by the strapping line.

2. The phase change memory device according to claim 1, wherein the phase change variable resistor comprises a chalcogenide containing compound.

3. The phase change memory device according to claim 1 further comprises a word-line driving transistor formed in the peripheral area of the semiconductor substrate.

4. The phase change memory device according to claim 3, wherein the word-line driving transistor comprises a gate between a source and a drain.

5. The phase change memory device according to claim 4, wherein the strapping line is electrically connected to the source of the word-line driving transistor.

6. The phase change memory device according to claim 4, which further comprises:
   first plugs formed on and electrically connected to the gate and the drain; and
   first lines formed on and electrically connected to the first plugs such that the gate and the drain of the word-line driving transistor are electrically connected to respective corresponding first lines.

7. The phase change memory device according to claim 1, wherein the switching element is a diode.

8. The phase change memory device according to claim 1, further comprising a bit line formed over and electrically connected to the phase change variable resistor.

9. The phase change memory device according to claim 6 wherein the strapping line, the current paths, the first plugs and the first lines are formed from a single conductive layer.

10. The phase change memory device according to claim 1 further comprising a heat electrode electrically connected to the switching element and to the phase change variable resistor.

11. The phase change memory device according to claim 1 further comprising a bit line electrically connected to the phase change variable resistor.

* * * * *